US007990783B1

(12) United States Patent
Clarke et al.

(10) Patent No.: US 7,990,783 B1
(45) Date of Patent: Aug. 2, 2011

(54) POSTAMBLE TIMING FOR DDR MEMORIES

(75) Inventors: Philip Clarke, Leatherhead (GB); Andrew Bellis, Guildford (GB); Yan Chong, San Jose, CA (US); Joseph Huang, Morgan Hill, CA (US); Michael H. M. Chu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/004,136

(22) Filed: Jan. 11, 2011

Related U.S. Application Data

(63) Continuation of application No. 11/935,405, filed on Nov. 6, 2007, now Pat. No. 7,876,630.

(60) Provisional application No. 60/857,414, filed on Nov. 6, 2006.

(51) Int. Cl.
*G11C 7/00* (2006.01)
*H03K 19/00* (2006.01)
*H03K 5/12* (2006.01)

(52) U.S. Cl. .......... 365/193; 326/93; 327/170; 327/172; 714/718; 714/721

(58) Field of Classification Search .............. 365/193, 365/189.05, 233.13; 326/21, 29, 93; 327/170, 327/172–176; 714/718, 721
See application file for complete search history.

(56) References Cited

U.S. PATENT DOCUMENTS

| 4,133,050 | A  | * | 1/1979 | Sell ........................... 365/213 |
| 4,600,845 | A  | * | 7/1986 | McKenna, Jr. ............... 327/172 |
| 4,970,687 | A  | * | 11/1990 | Usami et al. ............ 365/189.16 |
| 6,046,616 | A  | * | 4/2000 | Chan et al. ................... 327/164 |
| 6,215,726 | B1 | * | 4/2001 | Kubo ..................... 365/233.17 |
| 6,563,759 | B2 | * | 5/2003 | Yahata et al. ............. 365/233.1 |
| 7,016,237 | B2 | * | 3/2006 | Lee et al. ................. 365/189.05 |
| 7,463,534 | B2 | * | 12/2008 | Ku et al. ................. 365/189.011 |
| 7,791,965 | B2 | * | 9/2010 | Lee ............................. 365/193 |
| 2002/0079943 | A1 | * | 6/2002 | Dubey ........................ 327/291 |
| 2003/0147299 | A1 | * | 8/2003 | Setogawa ..................... 365/233 |
| 2005/0018494 | A1 | * | 1/2005 | Wu et al. ..................... 365/193 |
| 2009/0161454 | A1 | * | 6/2009 | Lee .............................. 365/193 |

* cited by examiner

*Primary Examiner* — Rexford N Barnie
*Assistant Examiner* — Matthew C Tabler
(74) *Attorney, Agent, or Firm* — Ropes & Gray LLP

(57) ABSTRACT

Circuits, methods, and apparatus that isolate an input register from spurious transitions on a DQS signal. One example receives an enable signal from a core. A logic circuit, which may be referred to as a one-half period circuit, shortens enable pulses at their front end by one-half a period. The shortened enable signal is passed to a storage element such as a register. Active pulses of the shortened enable signal clear the register, which provides a control signal closing a switch, such as an AND gate. The switch passes the DQS signal to the input register when closed and isolates the input register from the DQS signal when open. The shortened enable signal prevents the switch from opening early and passing spurious transitions on the DQS signal, for example during back-to-back non-consecutive read cycles.

20 Claims, 12 Drawing Sheets

SET-UP AND HOLD RETIMING

US 7,990,783 B1

POSTAMBLE TIMING FOR DDR MEMORIES

CROSS-REFERENCES TO RELATED APPLICATIONS

This application is a continuation of, and claims the benefit of and priority to, U.S. patent application Ser. No. 11/935,405, filed Nov. 6, 2007, which claims the benefit of and priority to U.S. provisional application No. 60/857,414, titled POSTAMBLE TIMING FOR DDR MEMORIES, by Clarke et al., filed Nov. 6, 2006, each of which is incorporated herein by reference in its respective entirety.

BACKGROUND

The present invention relates generally to enabling and disabling DQS signals, and more particularly to enabling and disabling DQS signals such that spurious DQS edges do not cause false clocking at the end of a DQS postamble or between back-to-back non-consecutive reads.

Memory interface circuits have become very important in integrated circuits including programmable circuits such as field programmable gate arrays (FPGAs). The data rates of these interfaces have increased greatly, particularly as new double-data-rate standards such as DDR2 and DDR3 have come into use. This increase in data rate has greatly increased the requirements on the timing of signals at the memory interface circuits.

During a data read from memory, these memory interfaces typically receive a number of groups of signals, each group including a number of data or DQ signals and a data strobe or DQS signal, which may be single ended or differential. The DQS signal is generally provided on a bidirectional bus. At the end of a read transaction, the driver providing the DQS signal returns to high impedance state. As a result, the voltage levels sensed may be indeterminate, potentially generating spurious edges of DQS in the receiving device or devices.

The reception of data is typically followed by a postamble period. At the end of this postamble period, the DQS drivers return to the high-impedance state. When the DQS pins are at an intermediate voltage, an input register clocked by the DQS signal may receive one or more spurious clock pulses. Also, at the end of a postamble period, a second back-to-back non-consecutive read may occur. The start of the second read may also cause the input register to receive one or more spurious clock pulses.

Timing complications arise not only with signals external to the memory interface, but with internal signals as well. For example, in an FPGA, enable signals that gate a DQS signal typically originate in its core circuits. These enable signals need to be provided to input/output circuits that may be an indeterminate distance from the core circuits. This leads to uncertainty in signal routing between the core and input/output circuits, which leads to uncertainty in the timing of the signals arrival the input/output circuits from the core.

Thus, what is needed are circuits, methods, and apparatus that can be controlled to isolate an input register or registers from spurious transitions on a DQS signal, both at the end of a DQS postamble and at the start of a back-to-back non-consecutive read. It is also desirable that these circuits, methods, and apparatus ease the transfer of DQS enable signals from a core to input/output circuits.

SUMMARY

Accordingly, embodiments of the present invention provide circuits, methods, and apparatus that can be controlled to isolate an input register or registers from spurious transitions on a DQS signal and ease the timing of enable signal transfers from a core to an input/output circuit. An exemplary embodiment of the present invention receives an enable signal from a core. A logic circuit, which may be referred to as a one-half period circuit, shortens enable pulses at their front end by one-half a period. The shortened enable signal is passed to a storage element, such as a register. When the shortened enable signal is active, it clears the register, which provides a control signal closing a switch, such as an AND gate. The switch passes the DQS signal to the input register when closed and isolates the input register from the DQS signal when open. After the shortened enable signal becomes inactive, a next edge of the DQS signal resets the register, which then opens the switch, thereby disconnecting the DQS signal from the input register. The shortened enable signal prevents the switch from opening early and passing spurious transitions on the DQS signal, for example during back-to-back non-consecutive reads.

A specific embodiment of the present invention resides in an input/output (IO) block and receives a plurality of enable signals from a plurality of core registers. The timing of the transfer of data from core circuits to an IO block is often difficult since the possible route paths may range from the very short to the very long. Accordingly, a plurality of enable signals is used, since each enable signal may operate at a lower frequency. The plurality of parallel enable signals is converted to a higher speed serial enable signal in the IO block. A retiming circuit may also be used to aid in the data transfer from the core to the IO. A one-half period circuit then shortens enable pulses in the serial enable signal. The output of the one-half period circuit clears a gating register, the inverting output of which is a gate signal received by an AND gate. The AND gate also receives the DQS signal. The output of the DQS signal clocks an input register and the gating register.

This example circuitry opens the switch at the end of a DQS postamble at the last valid DQS falling edge. This isolates the input register from clock glitches that may occur as DQS returns to a high-impedance state at the end of the DQS postamble. This example circuitry also shortens an enable pulse by removing one-half of a clock cycle from the front of the pulse. This keeps the switch open at the beginning of an enable pulse, thus isolating the input register from clock glitches that otherwise may occur between back-to-back non-consecutive reads.

Various embodiments of the present invention may incorporate one or more of these and the other features described herein. A better understanding of the nature and advantages of the present invention may be gained with reference to the following detailed description and the accompanying drawings.

DESCRIPTION OF EXEMPLARY EMBODIMENTS

Figure 1:
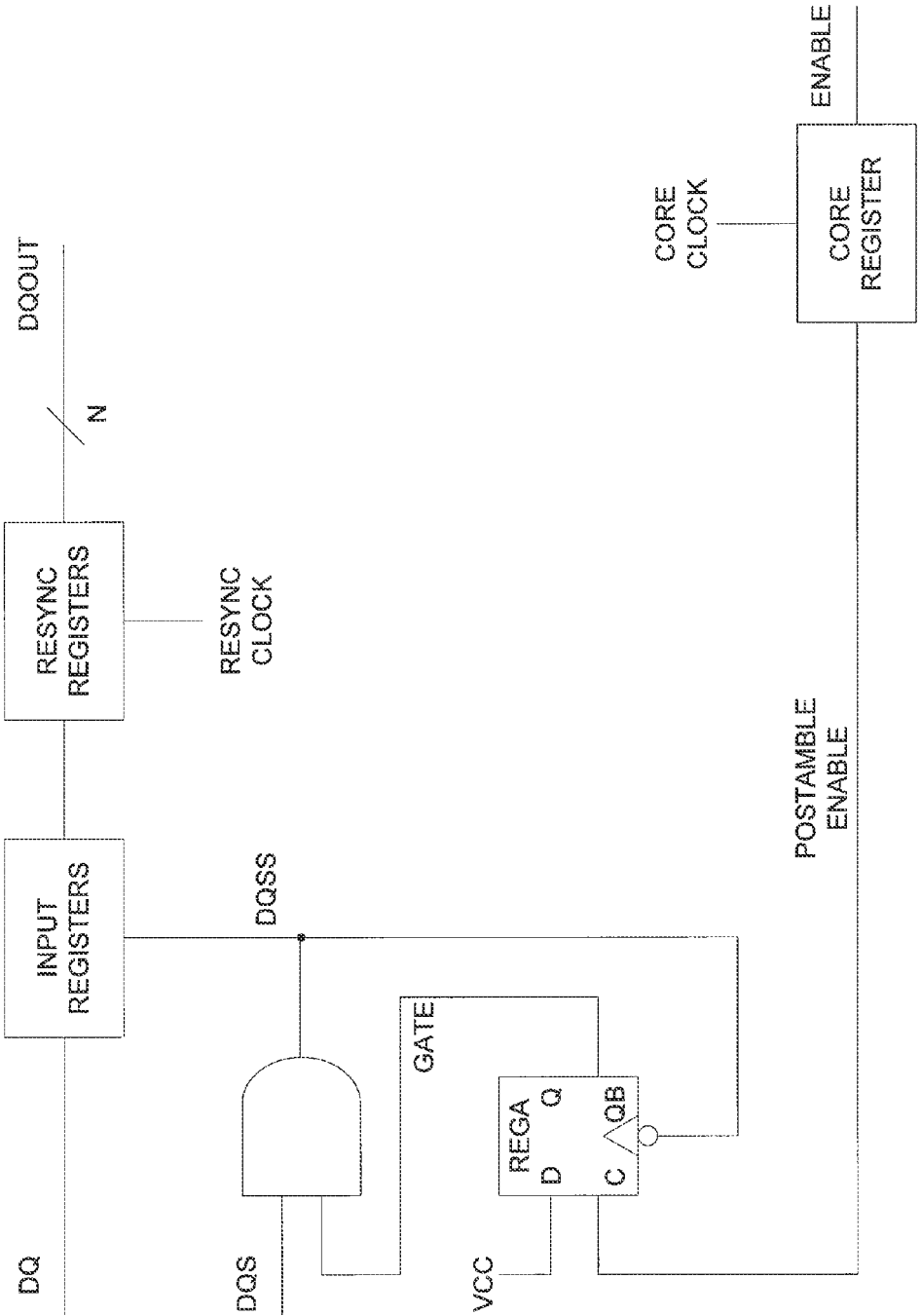
FIG. 1 is a block diagram of a portion of a read path in a memory interface that may be improved by the incorporation of an embodiment of the present invention.

FIG. 1 is a block diagram of a portion of a read path in a memory interface that may be improved by the incorporation of an embodiment of the present invention. This block diagram illustrates circuitry associated with an example DQ/DQS group having only one DQ input and one DQS input. In this example, only one DQ input is shown for simplicity, though typically several DQ inputs are included, where the several DQ inputs are clocked by one DQS signal. In conventional circuits, several DQ/DQS groups are received from a memory, which may be made up of a number of memory devices. Each DQS signal may be single-ended or differential in nature, though the use of differential DQS signaling is becoming more common, particularly with the introduction of DDR3, which mandates a differential DQS. During a read operation, the DQ and DQS signals are provided by the memory devices.

The DQS signal is typically received from an input buffer (not shown) and phase shifted approximately 90 degrees by a phase shift circuit (not shown) such that the DQSS edges are aligned between DQ edges. The DQS signal is gated by a logic gate, in this example, an AND gate. The AND gate, which operates as a switch, prevents or blocks the DQS signal from reaching the input registers when DQS is in a high-impedance state. The output of the AND gate clocks the input registers that are coupled to receive the DQ signals. While in these examples an AND gate is shown, in other embodiments of the present invention, the AND gate may be replaced by other circuits, such as other logic gates including combinatorial logic gates, pass gates, bus keepers in conjunction with pass gates, or other appropriate circuits. The outputs of the input registers are retimed to an internal resynchronizing clock by the resync registers.

The gating of the DQS signal is controlled by REGA. Register REGA receives an active high postamble enable signal at its clear input and provides a gate signal having a high level at its QB output. The high gate signal is received by the AND gate, which allows the DQS signal to propagate forward as the DQSS signal. After the postamble enable signal is deasserted, the gate signal remains high until the following falling edge of the DQSS signal. At that time, the gate signal returns low, thus preventing the AND gate from passing the DQS signal forward. While in these examples, a register having a clear input is shown, in other embodiments of the present invention, other circuits may be employed. For example, a latch or other storage circuit may be used. The register or other circuit may be set instead of cleared, in which case the Q output is used instead of the QB output and a logic low level is provided at the D input. Other changes may be made consistent with embodiments of the present invention, for example REGA may be rising edge triggered instead of falling edge triggered.

The postamble enable signal is provided by a register in the core. Even on one chip, considering the different DQ/DQS groups in one memory interface, the signal path length from the core register to REGA may vary considerably. A long path can generate a large delay that is also temperature and voltage variant. A long delay complicates the timing, particularly in a high-speed interface, between the core register and REGA. This in turn limits the maximum operating frequency of the memory interface. Also, the core registers are clocked by a core clock signal, which consumes important device resources.

At the end and the DQS burst, the circuit in the memory device providing the DQS signal enters a high-impedance or high-Z state. At this time, the voltage on the DQS may float, for example, to an intermediate level between a logic high and a logic low level. These spurious transitions may generate spurious DQS clock pulses. The operation of REGA effectively blocks the passage of these spurious pulses through the AND gate. However, if a second, separate read pulse occurs close to the end of the first read pulse (an event referred to here as a back-to-back non-consecutive read), REGA may enable the AND gate and allow the spurious transitions to pass through to the input registers. A timing diagram illustrating this is shown in the following figure.

Figure 2:
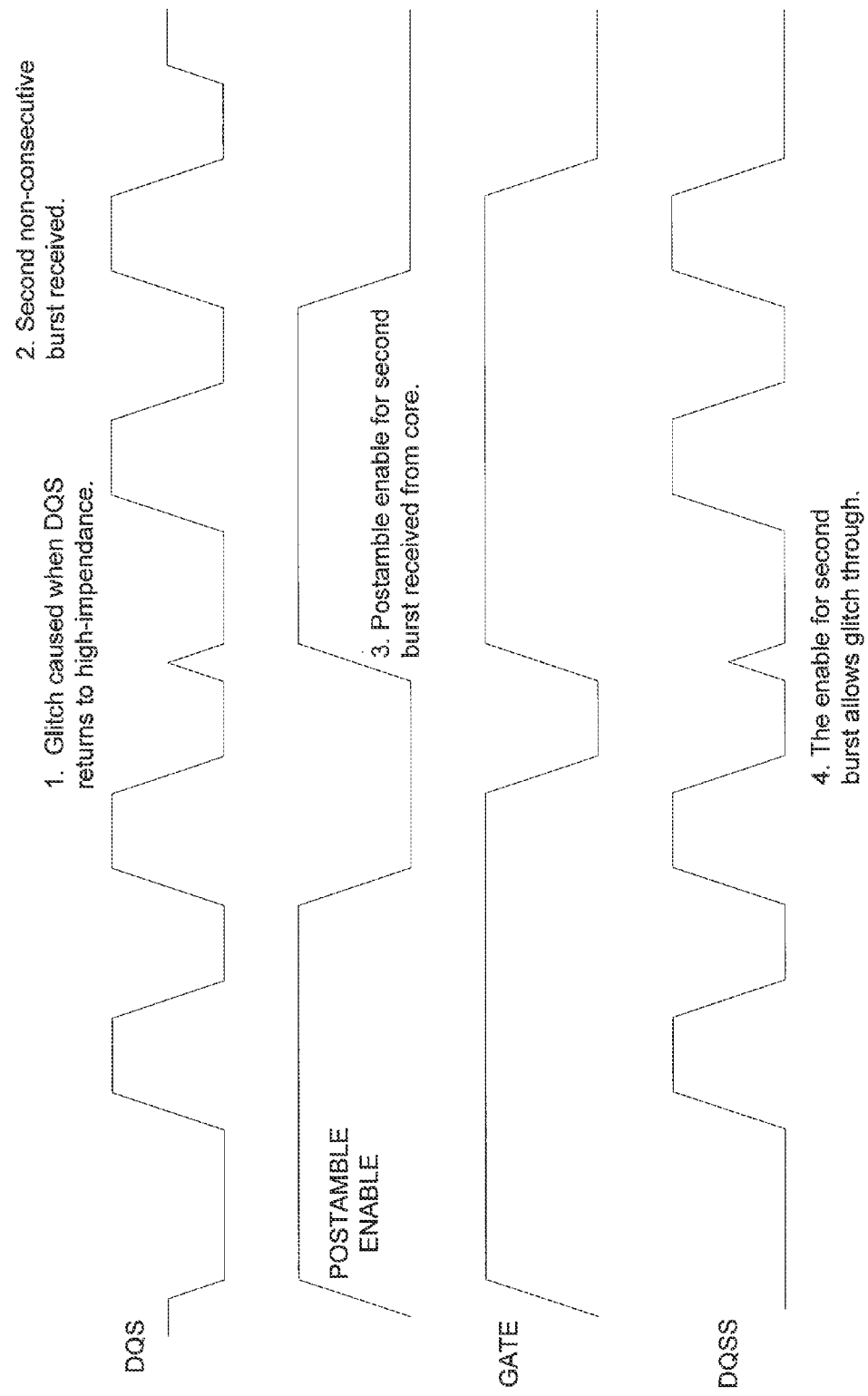
FIG. 2 is a timing diagram illustrating a difficulty present in the circuitry of FIG. 1.

FIG. 2 is a timing diagram illustrating a difficulty present in the circuitry of FIG. 1. This figure illustrates DQS, postamble enable, GATE, and DQSS signals that may be present in the circuitry of FIG. 1.

A first DQS read burst occurs. This read burst is shown here as two DQS pulses for simplicity. Following this DQS read burst, the circuit providing the DQS signal returns to a high impedance state. At this time a glitch can occur, as shown in note 1. Following this, a second non-consecutive DQS read burst, also including only two DQS pulses for simplicity, is received. (If the read bursts are consecutive, the DQS signal does not return to the high impedance state between bursts, and this problem is avoided.)

Postamble enable pulses are received for the first and second DQS bursts. A GATE signal is generated by the storage element. Specifically, the GATE signal is asserted high following the reception of a postamble enable rising edge. The GATE signal returns low following the first falling edge of the DQS signal after the postamble enable signal returns low. In this example, the postamble enable signal for the second bursts results in the GATE signal going high early enough such that the glitch passes through to the DQSS line, as is shown by note 4.

Accordingly, embodiments of the present invention delay the beginning of the GATE signal for these DQS bursts by one-half of a clock signal. An example is shown in the following figure.

Figure 3:
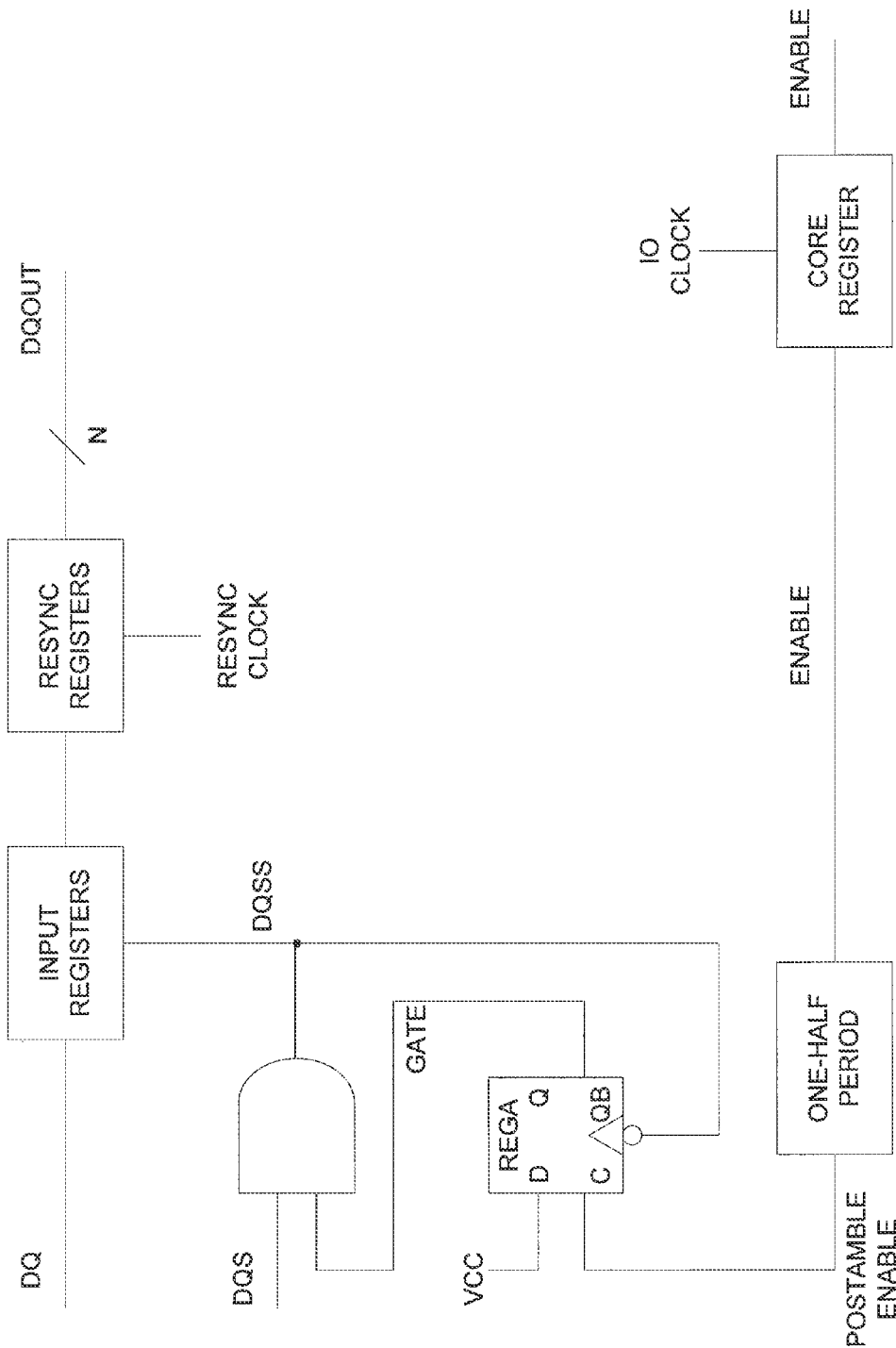
FIG. 3 is a block diagram of a DQS enable circuit according to an embodiment of the present invention.

FIG. 3 is a block diagram of a DQS enable circuit according to an embodiment of the present invention. In this figure, a circuit referred to as a one-half period circuit has been inserted between the core registers and REGA. Also, to reduce the resources in the core that are used by this circuitry, the core registers are clocked by an IO clock. This IO clock may be the same as the resync clock. As before, only one DQ input has been shown for simplicity, though typically several DQ signals are clocked by a DQS signal. In such a circuit, only one REGA and its associated circuitry is needed to gate the DQS signal, and while this circuitry is typically repeated for each DQS signal, some or all of it may be shared between two or more DQS inputs. Again, the DQS signal may be single-ended or differential in nature. The DQS signal is typically received using an input buffer (not shown) and phase shifted by approximately 90 degrees using a phase-shift circuit (not shown).

The purpose of the one-half period circuit is to swallow, absorb, or remove, the first one-half clock period of each DQS enable pulse. Specifically, when the core registers provide an edge that asserts DQS enable, the one-half period circuit waits one half of a clock cycle before passing this edge to REGA. When the core registers provide an edge that deasserts DQS enable, the one-half period circuit passes in this edge directly to REGA. A timing diagram illustrating the operation of this circuit is shown in the following figure.

Figure 4:
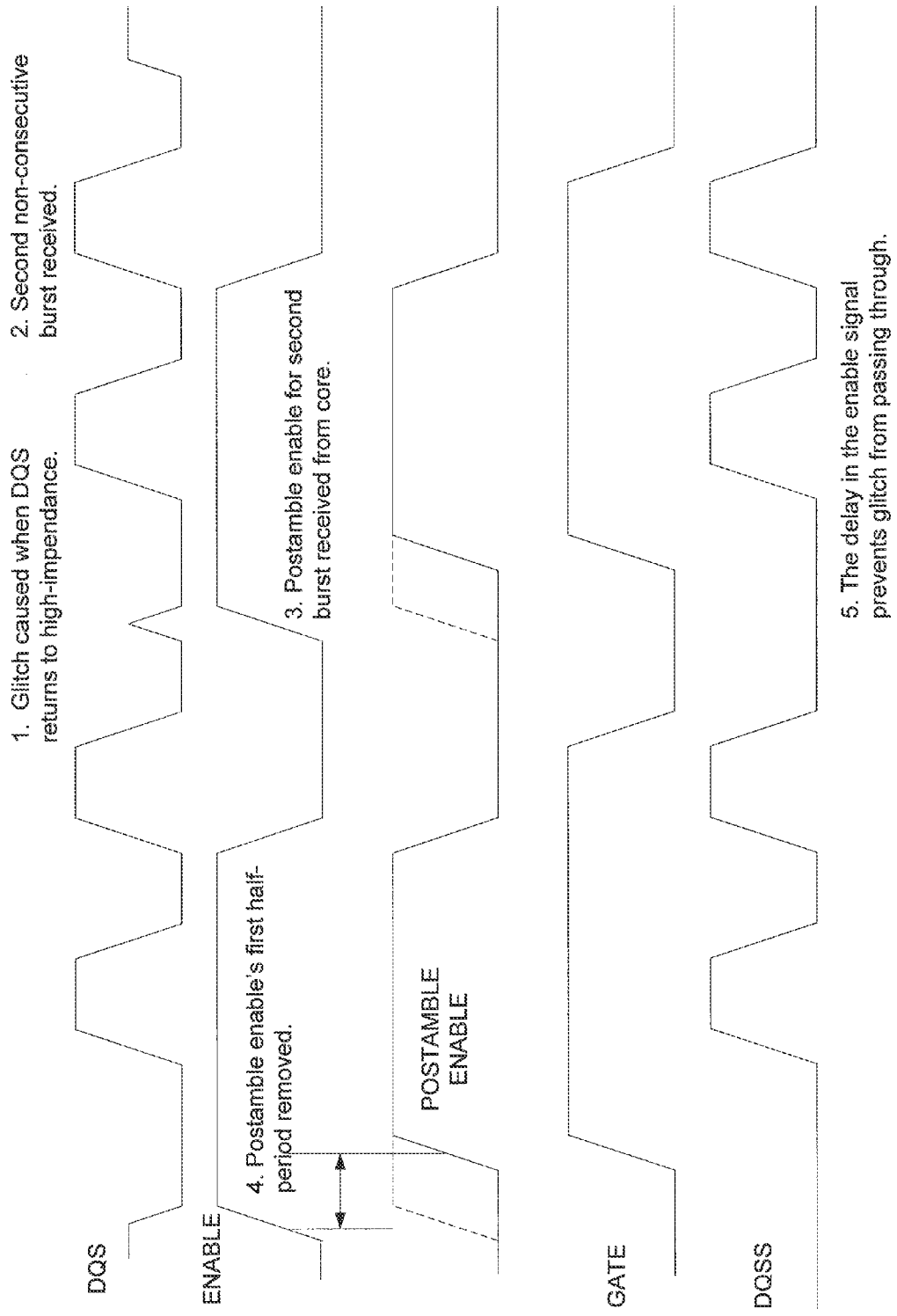
FIG. 4 is a timing diagram illustrating the operation of the embodiment of the present invention illustrated in FIG. 3.

FIG. 4 is a timing diagram illustrating the operation of the embodiment of the present invention illustrated in FIG. 3. Again, DQS pulses for a first DQS bursts are received. Following this, the circuit providing the DQS signal returns to a high impedance state. This may allow a glitch to occur in the DQS signal, as shown by note 1. This glitch may be caused by one or more of several sources. For example, there may be ringing or reflections on the DQS signal lines. Also, pull-up or pull-down impedances may be included to reduce these effects, but they may be excessively large, thereby reducing their effectiveness. A second non-consecutive read burst is then received, as is shown by note 2.

Enable pulses are received from the core circuits as shown. The enable signals are shortened to generate the postamble enable signal. The postamble enable signal is used to generate the GATE signal as described above. Since the postamble enable signal has been shortened by one-half a clock period, the GATE signal is not asserted early enough to allow the DQS glitch to pass through the AND gate. Accordingly, the input registers are isolated from the DQS glitch.

Again, because of the uncertainty in the route path length, it can be very difficult to control the timing between the core registers and the input/output circuitry. Accordingly, embodiments of the present invention provide circuitry to ease the timing constraints of the transfer of the enable signals from the core circuits to REGA. An example of this is shown in the following figure.

Figure 5:
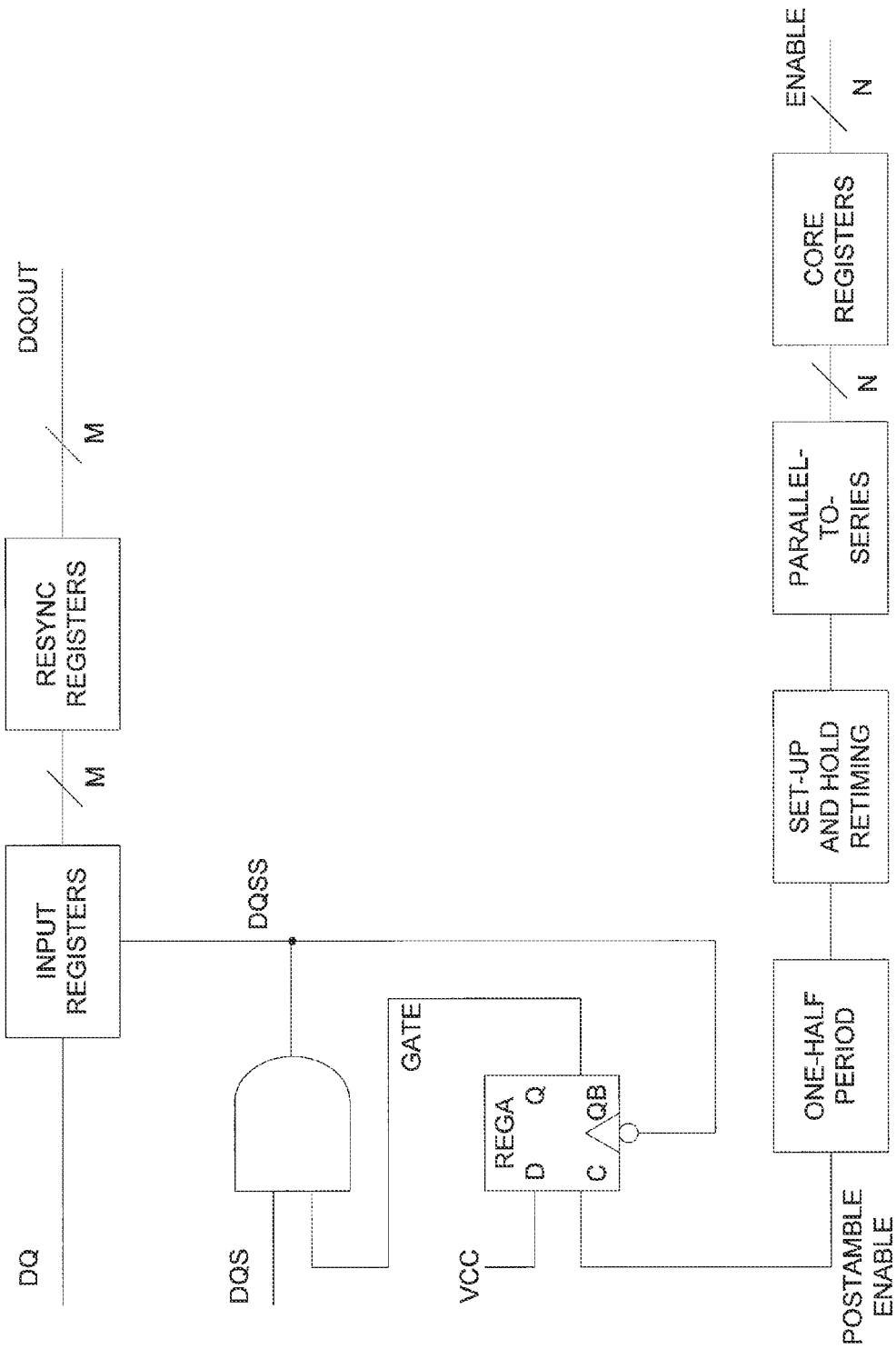
FIG. 5 is a block diagram of another DQS enable circuit according to an embodiment of the present invention.

FIG. 5 is a block diagram of another DQS enable circuit according to an embodiment of the present invention. In this block diagram, the core register has been replaced by a number of core registers, and a parallel-to-serial converter and a set-up and hold retiming circuit have been inserted between the core registers and the one-half period circuit. As before, only one DQ input has been shown for simplicity, though typically several DQ signals are clocked by one DQS signal. In such a circuit, only one REGA and its associated circuitry is needed to gate the DQS signal, and while this circuitry is typically repeated for each DQS signal, some or all of it may be shared between two or more DQS inputs. Again, the DQS signal may be single-ended or differential in nature. The DQS signal is typically received using an input buffer (not shown) and phase shifted by approximately 90 degrees using a phase-shift circuit (not shown).

A plurality of core registers are used such that the frequency of the signals being transferred to the I/O circuit from the core circuit is reduced. In this example, N enable signals are registered by N core registers. In various embodiments of the present invention, N may equal 2, 3, 4, or other numbers. These enable signals are received by a parallel-to-serial converter, which generates a higher speed serial enable signal. The higher speed serial signal is received by the set-up and hold retiming circuit. The set-up and hold retiming circuit adjusts the timing of the serial enable signal, such that it is received by the one-half period circuit at the proper time.

Again, the one-half period circuit removes the first one-half clock cycle of each enable pulse received from the set-up and hold retiming circuit in order to generate a postamble enable signal. The postamble enable signal is received at an asynchronous clear input of REGA. When REGA is cleared, the gate signal provided by REGA is high, which allows the DQS signal to pass forward through the AND gate as the DQSS signal.

In this example, the input registers essentially act as a series-to-parallel converter, providing M outputs. In various embodiments of the present invention, M may equal 2, 3, 4, or other number. The DQSS signal clocks the input registers allowing DQ data to be provided to the resync registers. The DQS signal also clocks REGA, whose D input is coupled to a logic high level, such as VCC. After the postamble enable signal is deasserted, the first falling edge of DQSS signal clocks the high level through REGA, after which the GATE signal returns low, thereby preventing the DQS signal from passing through the AND gate as the DQSS signal. At this time, the DQSS signal remains low and does not clock the input registers. A flowchart illustrating the operation of this circuit is shown in the following figure.

Figure 6:
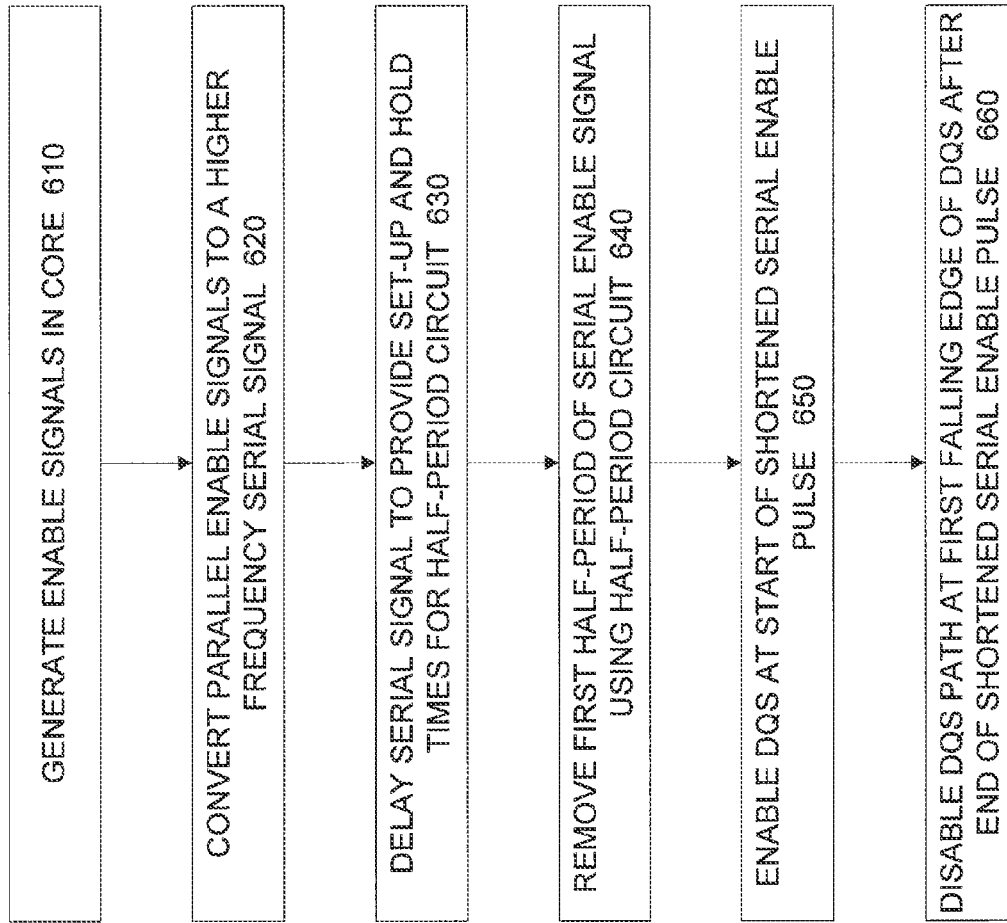
FIG. 6 is a flowchart illustrating the operation of the circuitry shown in FIG. 5.

FIG. 6 is a flowchart illustrating the operation of the circuitry shown in FIG. 5. In this example, a number of parallel enable signals are generated in the core in act 610. In act 620, the parallel enable signals are converted to a higher frequency serial signal. The serial signal is delayed to provide proper set-up and hold times for a half-period circuit in act 630. The first one-half clock period of the serial enable signal is removed using a half-period circuit in act 640.

A DQS path is enabled at the start of this shortened serial enable pulses in act 650. In act 660, the DQS path is disabled at the first falling edge of DQS after the end of a shortened serial enable pulse.

The following figures illustrate specific embodiments of the above circuits. It will be apparent to one skilled in the art that variations on these and the other included circuits may be made consistent with embodiments of the present invention. These included circuits are shown for exemplary purposes only and do not limit either the possible embodiments of the present invention or the scope of the claims.

Figure 7:
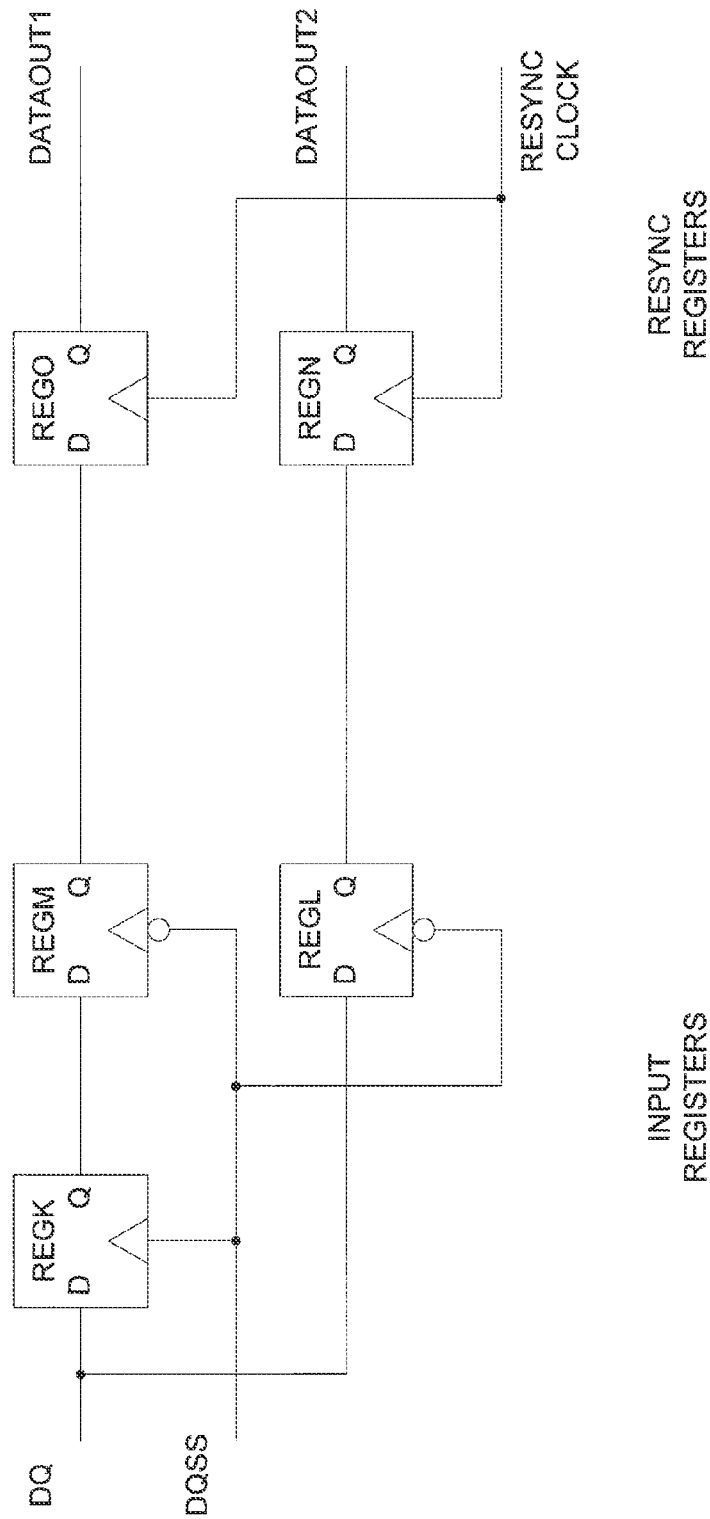
FIG. 7 illustrates input registers and resync registers that may be used as the input and resync registers of FIGS. 3 and 5, as well as input and resync registers in other embodiments of the present invention.

FIG. 7 illustrates input registers and resync registers that may be used as the input and resync registers of FIGS. 3 and 5, as well as input and resync registers in other embodiments of the present invention. In this example, the input registers include REGK, REGM, and REGL. The registers REGK and REGL receive the DQ signal, typically from an input buffer. These registers are clocked on opposite edges of the DQSS signal. The output of REGK is retimed using REGM, which is clocked by the same edge as REGL. REGM and REGL provide outputs to the resync registers on the same edges of the DQSS signal.

The resync registers include registers REGO and REGN. The resync registers are clocked by the resync clock and provide outputs DATAOUT1 and DATAOUT2, typically to core circuits. The phase of the resync clock may be adjusted to provide accurate data transfers from the input registers to the core circuitry.

Figure 8:
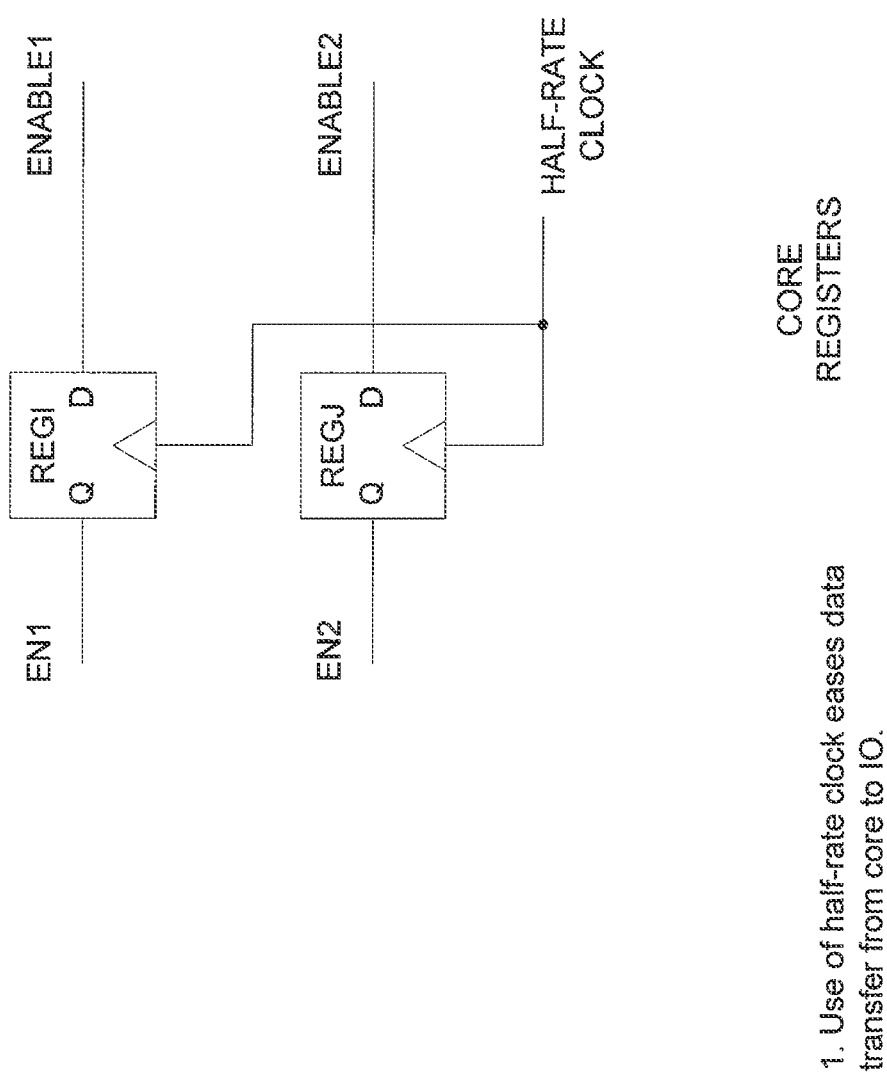
FIG. 8 illustrates a number of core registers according to an embodiment of the present invention.

FIG. 8 illustrates a number of core registers according to an embodiment of the present invention. In this example, the core registers include registers REGI and REGJ. These registers receive signals ENABLE1 and ENABLE2 from the core circuits and provide signals EN1 and EN2 to the I/O circuitry. In this example, there are two registers, so they are clocked using a one-half rate clock. In other embodiments of the present invention, other numbers of registers may be used and the clock rate may be correspondingly reduced. The use of the half-rate clock slows the frequency of the enable signals and eases the data transfer from the core to the I/O circuitry. The half-rate clock is generated in the IO circuit, possibly from the resync clock, thereby reducing the resources in the core that are used by this circuitry.

Figure 9:
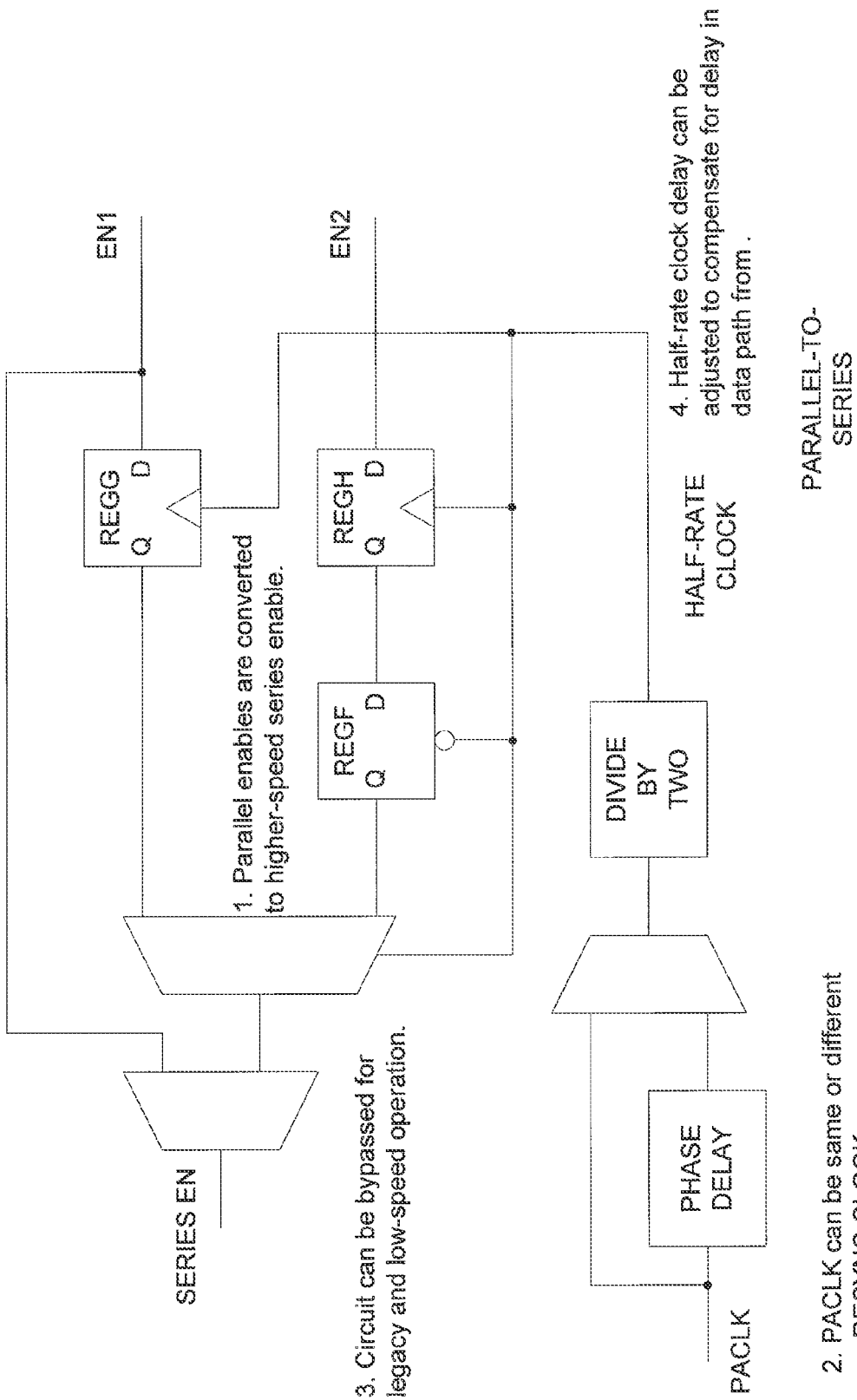
FIG. 9 is a block diagram illustrating a parallel-to-serial converter that may be used as the parallel-to-serial converter in FIG. 5, or as a parallel-to-serial converter in other embodiments of the present invention.

FIG. 9 is a block diagram illustrating a parallel-to-serial converter that may be used as the parallel-to-serial converter in FIG. 5, or as a parallel-to-serial converter in other embodiments of the present invention. This parallel-to-serial converter includes registers REGG, REGH, and REGF. Registers REGG and REGH receive the enable signals EN1 and EN2 from the core circuitry as shown previously. The output of REGH is retimed to the opposite edge of the clock by REGF. The outputs of REGG and REGF are multiplexed by a multiplexer whose inputs are under the control of the half rate clock such that a single higher-speed series enable signal is provided as SERIES EN. To make the present circuitry compatible with legacy or slow-speed implementations, the enable signal EN1 may be routed around the parallel-to-serial converter and provided as SERIES EN. For example, where the reduction in frequency of the signals from the core is not needed, this circuit may be bypassed and full rate signaling may be used.

In this example, the half-rate clock is generated by dividing a received clock signal by two. Accordingly, the divide-by-two circuit is included in the clock path. The clock signal may also be optionally delayed using a phase delay circuit. In a specific embodiment of the present invention, this half-rate clock is also used to clock the core registers.

Figure 10:
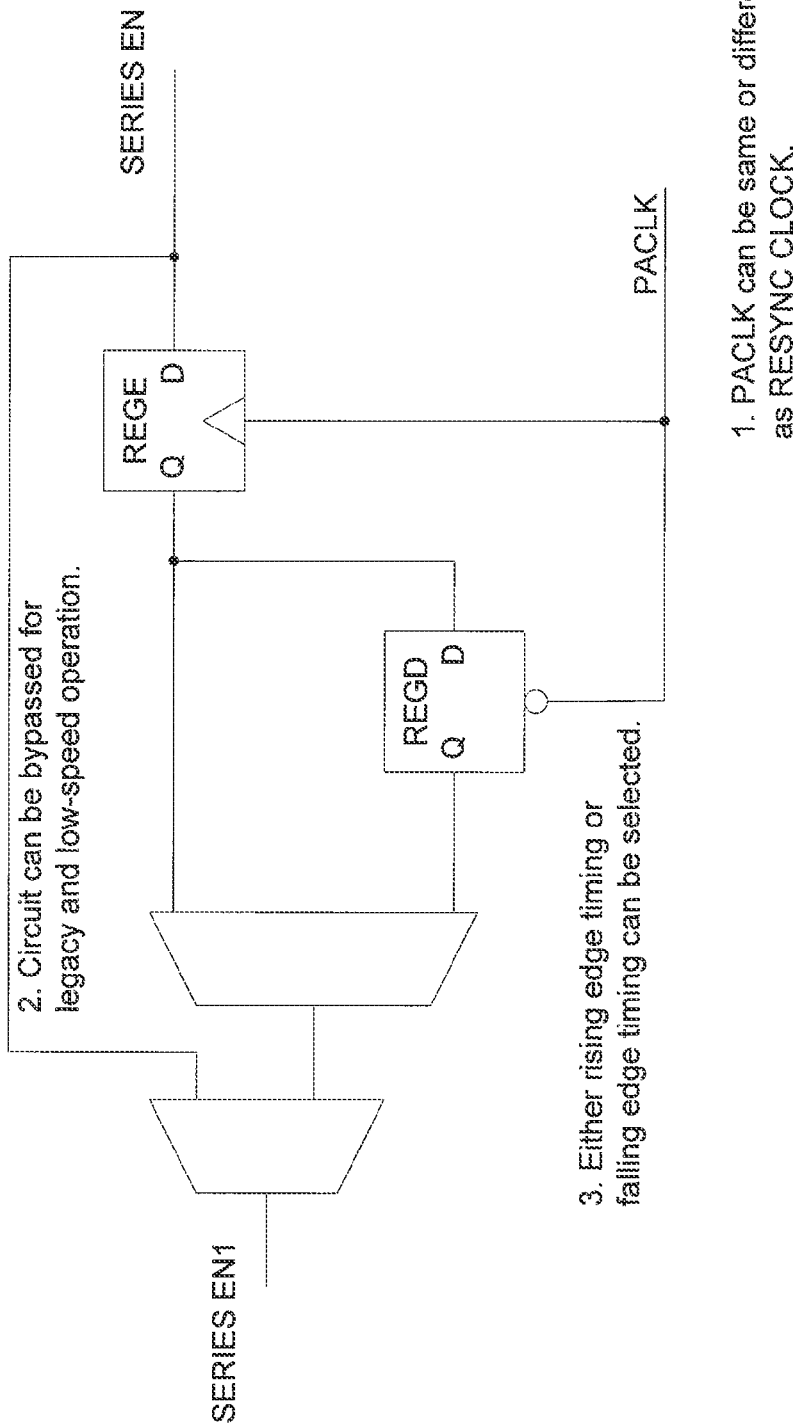
FIG. 10 is a block diagram of a set-up and hold retiming circuit that may be used as the set-up and hold retiming circuit in FIG. 5, or as a set-up and hold retiming circuit in other embodiments of the present invention.

FIG. 10 is a block diagram of a set-up and hold retiming circuit that may be used as the set-up and hold retiming circuit in FIG. 5, or as a set-up and hold retiming circuit in other embodiments of the present invention. This circuit includes registers REGE and REGD, the outputs of which are multiplexed and provided as the SERIES EN1 signal. As before, for legacy and low-speed operation, this circuit may be bypassed by multiplexing the SERIES EN signal as the SERIES EN1 signal. The output of REGE is retimed by the opposite edges of the clock signal by REGD. This circuit allows the series enable circuit to be shifted by 180 degrees, if necessary, for proper retiming by the following circuitry. That is, depending on the phase provided to the clock signal in the following circuit (the phase difference between the clock used to clock REGE and REGB in the following circuit) it may be desirable to shift the SERIES EN signal by 180 degrees to avoid set-up and hold problems with REGB in the following one-half period circuit.

Figure 11:
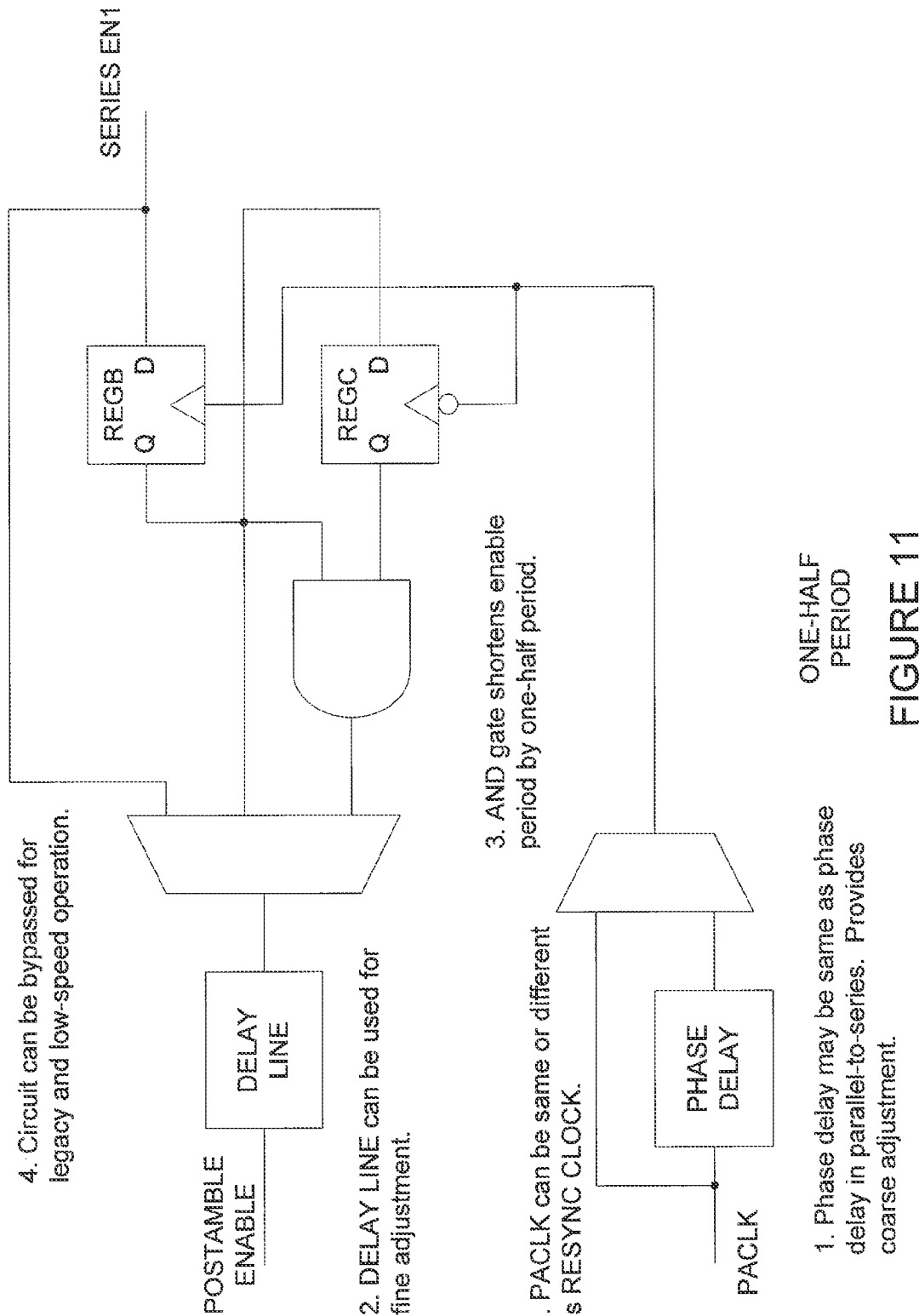
FIG. 11 is a schematic of a one-half period circuit that may be used as the one-half period circuit in FIGS. 3 and 5, or as a one-half period circuit in other embodiments of the present invention.

FIG. 11 is a schematic of a one-half period circuit that may be used as the one-half period circuit in FIGS. 3 and 5, or as a one-half period circuit in other embodiments of the present invention. This circuit includes registers REGB and REGC. The SERIES EN1 signal is received by REGB, the output of which is retimed to the opposite edge of the clock signal by REGC. The outputs of REGB and REGC are ANDED together by AND gate, delayed, and provided as the postamble enable signal. In this way, at a first clock rising edge after a rising edge of the SERIES EN1 signal, the output of REGB is high, while the output of REGC remains low. The output of REGC remains low for one-half of a clock cycle, until the next falling edge of the clock, whereupon the output of REGC is asserted high. At this time, both register outputs are high, and the postamble enable signal goes high. Once the SERIES EN1 signal is low, the output of REGB returns low at the next clock rising edge, such that the output of the AND gate returns low. At this time, the postamble enable signal returns low. As with the other circuits shown, this circuit may be bypassed for legacy and low-speed operation by selecting the SERIES EN1 signal as the postamble enable signal. Also, the output of REGB may be selected as the postamble enable signal. This may be done when the parallel-to-serial converter and set-up and hold circuits are bypassed to provide an improvement in performance to legacy circuits.

The phase delay circuit may be used to delay the clock signal to ensure proper transfer of the postamble enable signal to REGA in FIGS. 3 and 5. In one specific embodiment of the present invention, the phase delay provides a coarse adjustment of the postamble enable timing. This phase delay is typically compensated for supply voltage and temperature changes. The phase delay may be the same phase delay as shown in the parallel-to-serial converter in FIG. 9, or it may be a separate phase delay.

The delay line is used to provide a fine adjustment to the postamble enable timing. Since the delay line provides a shorter, finer adjustment than the phase delay, this delay is typically not voltage and temperature compensated, though some embodiments of the present invention compensate the delay line for changes in the temperature and voltage. Also, in embodiments of the present invention where the resync clock is used for the enable path, the delay in the DQS path to the input registers can be compensated for by the delay line.

The variable phase delay provided by the phase delay and delay line circuits allow a different enable signal to be used for each DQ/DQS group. This is particularly useful in DDR3 applications where DQ/DQS signal groups may arrive at an interface at different times. This also allows one clock source to be used for all DQ/DQS groups, further conserving clocking resources.

The various delays, such as the phase delay and delay line may be calibrated in various ways consistent with embodiments of the present invention. For example, they may be determined statically or dynamically. The decision on whether to select the output of REGE or REGD in the set-up and hold circuit can be similarly determined.

For example, the timing may be statically determined by determining the speed grade of the device, a step that is common in integrated circuit manufacturing. By finding the timing of a DQS signal, the optimum timing for the postamble enable signal may be found.

The static method works well for some comparatively less demanding specifications, such as DDR2. However, for DDR3, a dynamic determination may be needed. This may be done by adjusting the delays until an error occurs, then reducing the phase shift by an amount near 180 degrees. In practice, because the point where errors occur is not a sharp line, the actual change in phase shift may be nearer to a phase shift such as 160 degrees.

Figure 12:
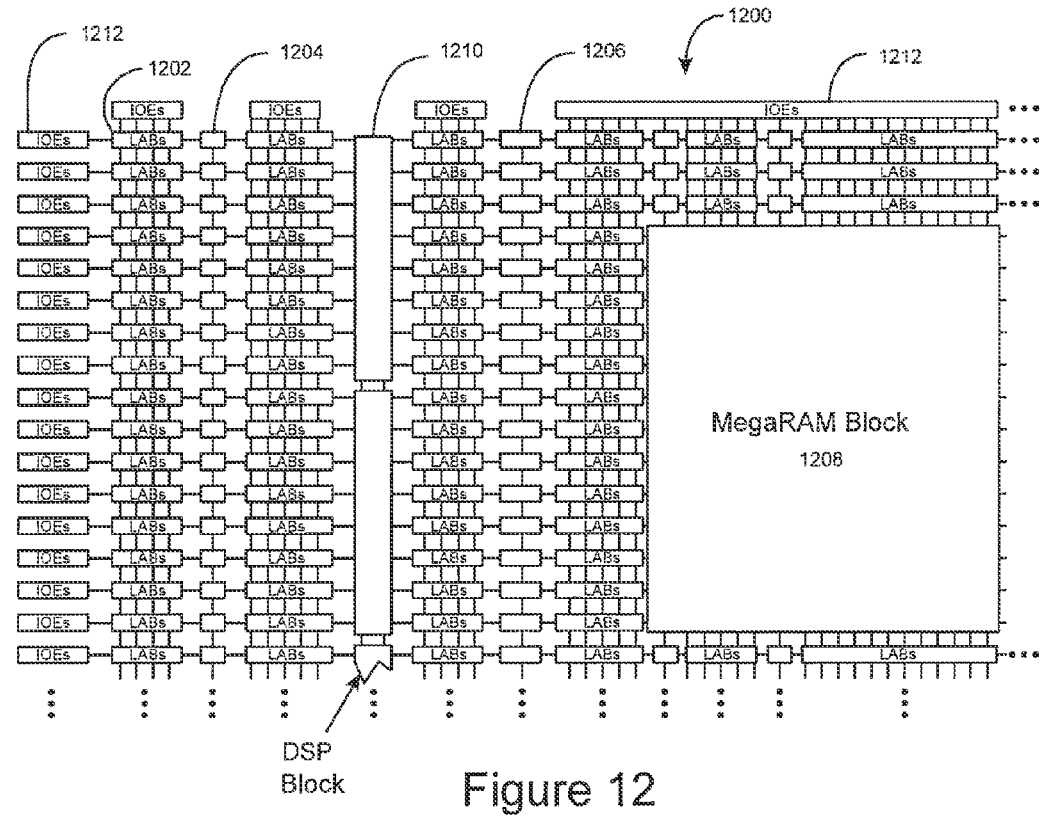
FIG. 12 is a simplified block diagram of a programmable logic device that is improved by incorporating embodiments of the present invention.

FIG. 12 is a simplified partial block diagram of an exemplary high-density programmable logic device or FPGA 1200 wherein techniques according to the present invention can be utilized. PLD 1200 includes a two-dimensional array of programmable logic array blocks (or LABs) 1202 that are interconnected by a network of column and row interconnections of varying length and speed. LABs 1202 include multiple (e.g., 10) logic elements (or LEs), an LE being a small unit of logic that provides for efficient implementation of user defined logic functions.

PLD 1200 also includes a distributed memory structure including RAM blocks of varying sizes provided throughout the array. The RAM blocks include, for example, 512 bit blocks 1204, 4 K blocks 1206, and an M-Block 1208 providing 512 bits of RAM. These memory blocks may also include shift registers and FIFO buffers. PLD 1200 further includes digital signal processing (DSP) blocks 1210 that can implement, for example, multipliers with addition or subtraction features.

It is to be understood that PLD 1200 is described herein for illustrative purposes only and that the present invention can be implemented in many different types of PLDs, FPGAs, and the other types of digital integrated circuits.

While PLDs or FPGAs of the type shown in FIG. 12 provide many of the resources required to implement system level solutions, the present invention can also benefit systems wherein a PLD is one of several components.

Figure 13:
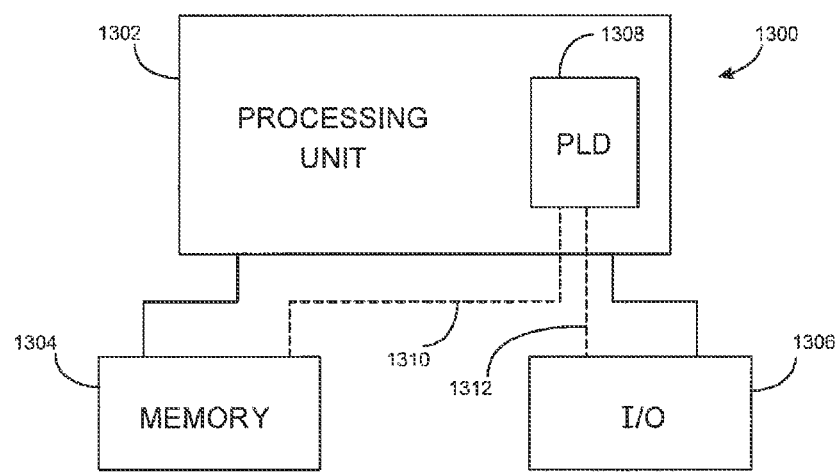
FIG. 13 is a block diagram of an electronic system that is improved by incorporating embodiments of the present invention.

FIG. 13 shows a block diagram of an exemplary digital system 1300, within which the present invention may be embodied. System 1300 can be a programmed digital computer system, digital signal processing system, specialized digital switching network, or other processing system. Moreover, such systems may be designed for a wide variety of applications, such as telecommunications systems, automotive systems, control systems, consumer electronics, personal computers, Internet communications and networking, and others. Further, system 1300 may be provided on a single board, on multiple boards, or within multiple enclosures.

System 1300 includes a processing unit 1302, a memory unit 1304 and an input/output unit 1306 interconnected together by one or more buses. According to this exemplary embodiment, a programmable logic device (PLD) 1308 is embedded in processing unit 1302. PLD 1308 may serve many different purposes within the system in FIG. 13. PLD 1308 can, for example, be a logical building block of processing unit 1302, supporting its internal and external operations. PLD 1308 is programmed to implement the logical functions necessary to carry on its particular role in system operation. PLD 1308 may be specially coupled to memory 1304 through connection 1310 and to input/output unit 1306 through connection 1312.

Processing unit 1302 may direct data to an appropriate system component for processing or storage, execute a program stored in memory 1304, or receive and transmit data via input/output unit 1306, or other similar function. Processing unit 1302 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 1308 can control the logical operations of the system. In an embodiment, PLD 1308 acts as a reconfigurable processor, which can be reprogrammed as needed to handle a particular computing task. Alternately, programmable logic device 1308 may itself include an embedded microprocessor. Memory unit 1304 may be a random access memory (RAM), read only memory (ROM), fixed or flexible disk media, PC card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a clock circuit operable to generate an enable signal, wherein the enable signal is characterized by a first duty cycle;
   a truncation circuit operable to:
      receive the enable signal as input,
      in response to expected locations of voltage peaks in a data strobe signal, delay the enable signal and reduce the first duty cycle of the enable signal to produce a shortened enable signal, and
      output the shortened enable signal;
   a combination circuit operable to combine the shortened enable signal with the data strobe signal to produce a probe signal; and
   a data storage circuit operable to output data stored in the data storage circuit in response to a voltage level of the probe signal.

2. The integrated circuit of claim 1, wherein the truncation circuit is further operable to reduce the first duty cycle of the enable signal by delaying a plurality of leading pulse edges of the enable signal.

3. The integrated circuit of claim 1, wherein the truncation circuit is further operable to delay the enable signal by an amount of time that depends on a temperature internal to the integrated circuit.

4. The integrated circuit of claim 1, wherein the truncation circuit is further operable to delay the enable signal by an amount of time that depends on a voltage supply level of the integrated circuit.

5. The integrated circuit of claim 1, wherein the combination circuit is further operable to combine the shortened enable signal with the data strobe signal by applying a logical AND operation to the shortened enable signal and the data strobe signal.

6. The integrated circuit of claim 1, wherein the truncation circuit is further operable to delay the enable signal by:
   applying a phase delay to the enable signal, the phase delay used to coarsely adjust an amount of delay; and
   applying a line delay to the enable signal, the line delay used to finely adjust the amount of delay.

7. The integrated circuit of claim 1, wherein the enable signal is generated by superimposing a plurality of sub-enable signals, wherein each of the sub-enable signals in the plurality of sub-enable signals is characterized by a duty cycle smaller than the first duty cycle.

8. A method of reducing errors in data obtained from a data storage unit, the method comprising:
   generating an enable signal, the enable signal characterized by a first duty cycle;
   in response to expected locations of voltage peaks in a data strobe signal, reducing the first duty cycle of the enable signal to produce a shortened enable signal;
   logically combining the shortened enable signal with the data strobe signal to produce a clocking signal; and
   probing the data storage unit using the clocking signal to obtain data from the data storage unit.

9. The method of claim 8, wherein reducing the first duty cycle of the enable signal comprises delaying a plurality of leading pulse edges of the enable signal.

10. The method of claim 8, wherein reducing the first duty cycle of the enable signal comprises delaying the enable signal by an amount of time that depends on a temperature internal to the integrated circuit.

11. The method of claim 8, wherein reducing the first duty cycle of the enable signal comprises delaying the enable signal by an amount of time that depends on a voltage supply level of the integrated circuit.

12. The method of claim 8, wherein logically combining the shortened enable signal with the data strobe signal comprises applying a logical AND operation to the shortened enable signal and the data strobe signal.

13. The method of claim 8, wherein reducing the first duty cycle of the enable signal comprises:
    applying a phase delay to the enable signal, the phase delay used to coarsely adjust an amount of delay; and
    applying a line delay to the enable signal, the line delay used to finely adjust the amount of delay.

14. The method of claim 8, wherein the enable signal is generated by superimposing a plurality of sub-enable signals, wherein each of the sub-enable signals in the plurality of sub-enable signals is characterized by a duty cycle smaller than the first duty cycle.

15. An integrated circuit comprising:
    a clock circuit operable to generate an enable signal;
    an interface circuit operable to:
        receive the enable signal as input;
        delay the enable signal by a first delay amount in response to expected locations of voltage peaks in a first data strobe signal, and combine the delayed enable signal with the first data strobe signal to produce a first probe signal;
        delay the enable signal by a second delay amount in response to expected locations of voltage peaks in a second data strobe signal, and combine the delayed enable signal with the second data strobe signal to produce a second probe signal; and
    a data storage circuit operable to provide output data at first set of times in response to a set of input voltage levels of the first probe signal, and provide output data at second set of times in response to a set of input voltage levels of the second probe signal.

16. The integrated circuit of claim 15, wherein the first probe signal is used to access data requested by a first data signal group at a first time and the second probe signal is used to access data requested by a second data signal group at a second time.

17. The integrated circuit of claim 15, wherein the interface circuit is operable to receive requests from the first data strobe signal and the second data strobe signal during non-overlapping time periods.

18. The integrated circuit of claim 15, wherein the interface circuit is operable to receive requests from the first data strobe signal and the second data strobe signal during overlapping time periods.

19. The integrated circuit of claim 15, wherein the enable signal is generated by superimposing a plurality of sub-enable signals.

20. The integrated circuit of claim 19, wherein a duty cycle of each of the plurality of sub-enable signals is substantially identical.

\* \* \* \* \*